United States Patent
Tomita et al.

(10) Patent No.: US 10,043,742 B2
(45) Date of Patent: Aug. 7, 2018

(54) SEMICONDUCTOR DEVICE

(71) Applicant: Renesas Electronics Corporation, Tokyo (JP)

(72) Inventors: Kazuo Tomita, Tokyo (JP); Keiichi Yamada, Tokyo (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/897,357

(22) Filed: Feb. 15, 2018

(65) Prior Publication Data

US 2018/0175014 A1 Jun. 21, 2018

Related U.S. Application Data

(63) Continuation of application No. 15/270,497, filed on Sep. 20, 2016, now Pat. No. 9,929,086, which is a
(Continued)

(51) Int. Cl.
  *H01L 23/522* (2006.01)
  *H01L 27/02* (2006.01)
  (Continued)

(52) U.S. Cl.
  CPC ...... *H01L 23/5223* (2013.01); *H01L 23/5222* (2013.01); *H01L 23/5286* (2013.01);
  (Continued)

(58) Field of Classification Search
  CPC ............ H01L 23/5222; H01L 23/5223; H01L 27/0288; H01L 27/0711; H01L 27/0733;
  (Continued)

(56) References Cited

U.S. PATENT DOCUMENTS 6,100,155 A    8/2000   Hu
9,460,840 B2   10/2016   Altunkilic et al.
(Continued)

FOREIGN PATENT DOCUMENTS

CN       1577849 A    2/2005
JP     60-060751 A    4/1985
(Continued)

OTHER PUBLICATIONS

Office Action dated Jul. 27, 2016, in Taiwanese Application No. 101124035.
Office Action dated Feb. 17, 2015, in Japanese Patent Application No. 2013-529811.
Office Action dated Mar. 14, 2016, in Chinese Application No. 201180073006.6.

*Primary Examiner* — Eduardo A Rodela
(74) *Attorney, Agent, or Firm* — Shapiro, Gabor and Rosenberger, PLLC

(57) ABSTRACT

In a semiconductor device (SD), plate-shaped upper electrodes (UEL) are formed on a lower electrode (LEL) with a dielectric film (DEC) interposed therebetween. The lower electrode (LEL), the dielectric film (DEC), and the upper electrodes (UEL) constitute MIM capacitors (MCA). One of the upper electrodes (UEL) and another upper electrode (UEL) that are adjacent to each other are arranged at an equal distance (D1), without the guard ring being interposed therebetween. The upper electrodes (UEL) positioned on the outermost periphery and the guard ring (GR) positioned outside those upper electrodes UEL are arranged at a distance equal to the distance (D1) from each other.

11 Claims, 22 Drawing Sheets

Related U.S. Application Data continuation of application No. 14/238,474, filed as application No. PCT/JP2011/069018 on Aug. 24, 2011, now Pat. No. 9,478,601.

(51) Int. Cl.
  *H01L 27/01* (2006.01)
  *H01L 23/58* (2006.01)
  *H01L 23/528* (2006.01)
  *H01L 27/08* (2006.01)
  *H01L 49/02* (2006.01)

(52) U.S. Cl.
  CPC .......... *H01L 23/585* (2013.01); *H01L 27/016* (2013.01); *H01L 27/0248* (2013.01); *H01L 27/0805* (2013.01); *H01L 28/40* (2013.01); *H01L 28/75* (2013.01); *H01L 28/86* (2013.01); *H01L 28/60* (2013.01); *H01L 28/82* (2013.01); *H01L 2924/0002* (2013.01)

(58) Field of Classification Search
  CPC ............... H01L 27/0805; H01L 27/101; H01L 2027/11842; H01L 28/40; H01L 28/60; H01L 28/82
  See application file for complete search history.

(56) References Cited

U.S. PATENT DOCUMENTS

| | | | |
|---|---|---|---|
| 9,929,086 B2 * | 3/2018 | Tomita | .................. H01L 23/585 |
| 2002/0102809 A1 | 8/2002 | Barth et al. | |
| 2003/0232483 A1 | 12/2003 | Fujiishi | |
| 2005/0006771 A1 | 1/2005 | Akiyama | |
| 2005/0012179 A1 | 1/2005 | Saito | |
| 2005/0082586 A1 | 4/2005 | Tu et al. | |
| 2006/0181656 A1 * | 8/2006 | Nabeshima | ......... H01L 27/0207 349/51 |
| 2008/0185685 A1 | 8/2008 | Nakashiba | |

FOREIGN PATENT DOCUMENTS

| | | |
|---|---|---|
| JP | 03-138973 A | 6/1991 |
| JP | 03-218063 A | 9/1991 |
| JP | 05-090489 A | 4/1993 |
| JP | 09-289286 A | 11/1997 |
| JP | 2005-038882 A | 2/2005 |
| JP | 2006-228803 A | 8/2006 |
| JP | 2010-093171 A | 4/2010 |
| WO | WO 2004/077568 A1 | 9/2004 |

* cited by examiner

LEL(ME3,M3)

SEMICONDUCTOR DEVICE

TECHNICAL FIELD

The present invention relates to a semiconductor device, and particularly a semiconductor device with MIM capacitors.

BACKGROUND ART

In a digital camera, for example, a semiconductor device with an AFE (Analog Front End) circuit is applied to process an analog signal of an image that has received light at a solid-state image sensing element or the like. In this analog front end circuit, parallel plate-shaped MIM (Metal Insulator Metal) capacitors are formed to convert the analog signal into a digital signal.

In the parallel plate-shaped MIM capacitors, a plurality of plate-shaped upper electrodes are formed on a plate-shaped lower electrode with a dielectric film being interposed therebetween. A guard ring is arranged between one of the upper electrodes and another upper electrode that are adjacent to each other in such a manner as to surround a periphery of the individual upper electrodes.

Patent documents 1 and 2 are mentioned as examples of documents that disclose semiconductor devices with such MIM capacitors.

CITATION LIST

Patent Document

PTD 1: Japanese Patent Laying-Open No. 2006-228803
PTD 2: Japanese Patent Laying-Open No. 2010-93171

SUMMARY OF INVENTION

Technical Problem

The conventional semiconductor devices, however, have had the following problems. As described above, in a conventional semiconductor device, a guard ring is arranged to surround the periphery of the individual upper electrodes that constitute MIM capacitors. For this reason, leakage current occurs due to a difference in potential between the MIM capacitors and the guard ring.

Moreover, in the semiconductor device with the analog front end circuit, the area occupied by an analog portion that processes the analog signal in the semiconductor device (chip) is relatively large, and besides, the MIM capacitors take up a relatively large area in the analog portion, which is one cause of hindering a size reduction of the semiconductor device.

The present invention was made as part of the development, and an object of the invention is to provide a semiconductor device having less leakage current and a reduced footprint of the MIM capacitors.

Solution to Problem

A semiconductor device according to one embodiment of the present invention includes a semiconductor substrate having a main surface, a plurality of MIM capacitors, and a guard ring. The plurality of MIM capacitors are arranged in a prescribed region on the main surface of the semiconductor substrate, and each includes a lower electrode, a dielectric film, and an upper electrode. The guard ring is arranged to surround all of the plurality of MIM capacitors. In the plurality of MIM capacitors, one MIM capacitor and another MIM capacitor that are adjacent to each other are arranged at a prescribed distance from each other without the guard ring being interposed between the one MIM capacitor and the other MIM capacitor, and a guard ring is arranged outside an outermost MIM capacitor of the plurality of MIM capacitors arranged, at a distance equal to the prescribed distance therefrom.

Advantageous Effects of Invention

With the semiconductor device according to one embodiment of the present invention, less leakage current and a reduced footprint of the MIM capacitors can be achieved.

DESCRIPTION OF EMBODIMENTS

First Embodiment

A semiconductor device with MIM capacitors according to a first embodiment of the present invention will be described. First, a digital camera will be briefly described as one example of an electronic device to which the semiconductor device of the present embodiment is applied.

Figure 1:
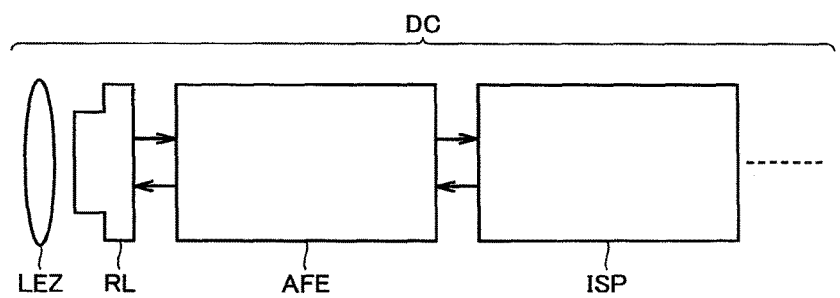
FIG. 1 is a partial block diagram illustrating a portion of the configuration of a digital camera as one example of an electronic device to which a semiconductor device according to a first embodiment of the present invention is applied.

As illustrated in FIG. 1, in a digital camera DC, light of the subject concentrated by a lens LEZ is received by an image sensor element RL such as a CCD (Charge Coupled Device), for example, where it is converted into a prescribed electrical signal as an analog signal for each pixel. The converted electrical signal is input into the analog front end circuit AFE as image information, and converted into a digital signal.

The image information converted into the digital signal is input into an image sensor processor ISP, where it is subjected to prescribed image processing. For example, the image information is subjected to processing to be recorded into a designated recording medium, or is displayed on a display (not illustrated). Note that digital camera DC is provided with a power supply circuit that causes digital camera DC to operate, a circuit that controls a motor for driving the lens and the like, a circuit for controlling causing a strobe to emit light, and the like (all not illustrated).

Figure 2:
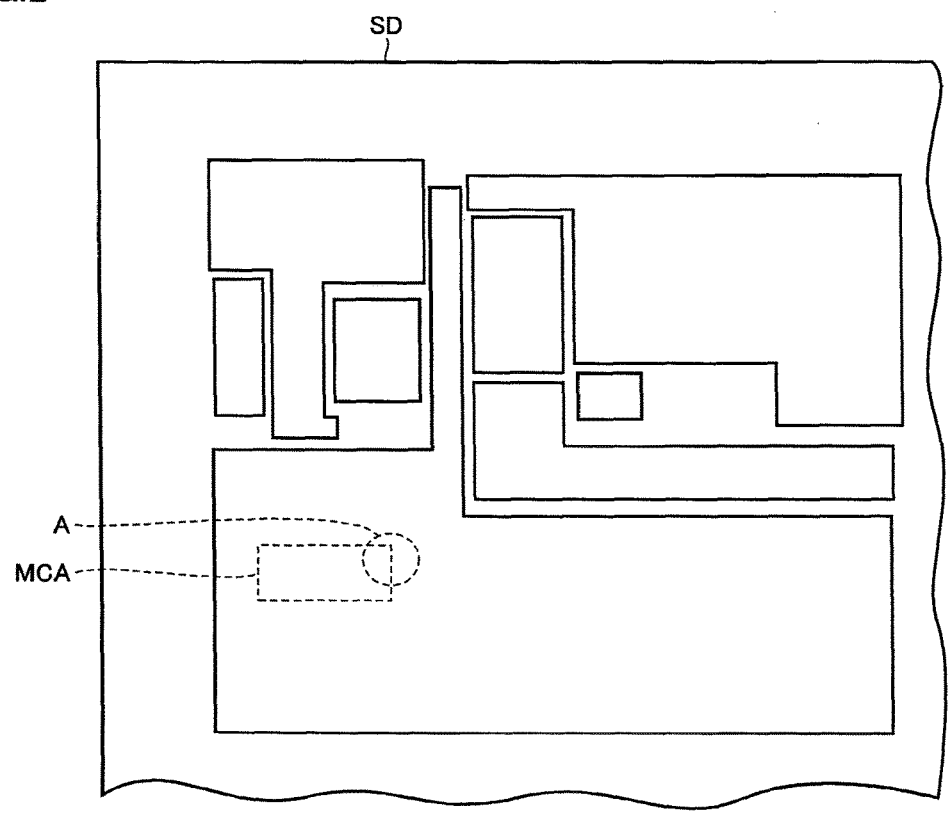
FIG. 2 is a partial plan view illustrating a portion of a layout of the semiconductor device to which the MIM capacitors are applied in the first embodiment.
Figure 3:
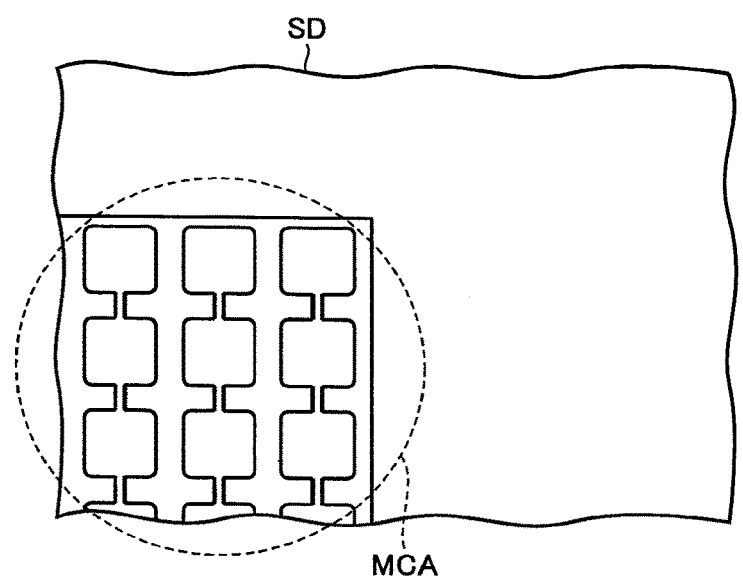
FIG. 3 is a partially enlarged plan view illustrating MIM capacitors within the dotted-line area A shown in FIG. 2 in the first embodiment.

The semiconductor device with MIM capacitors are particularly applied to the analog front end circuit AFE. FIG. 2 illustrates a portion of a planar layout of a semiconductor device SD with MIM capacitors MCA, and FIG. 3 is a partially enlarged plan view of a portion of MIMI capacitors MCA and a periphery thereof. As illustrated in FIGS. 2 and 3, MIM capacitors MCA are used in a 16-bit analog-to-digital conversion circuit portion, for example. In the analog-to-digital conversion circuit portion, the proportion of the area occupied by MIM capacitors MCA is relatively high.

The structure of such MIM capacitors will be described next. Here, parallel plate-shaped MIM capacitors that are arranged, for example, between a metal interconnect that is a third layer and a metal interconnect that is a fourth layer will be described by way of example, as MIM capacitors used in a semiconductor device with a multilayer interconnection structure.

Figure 4:
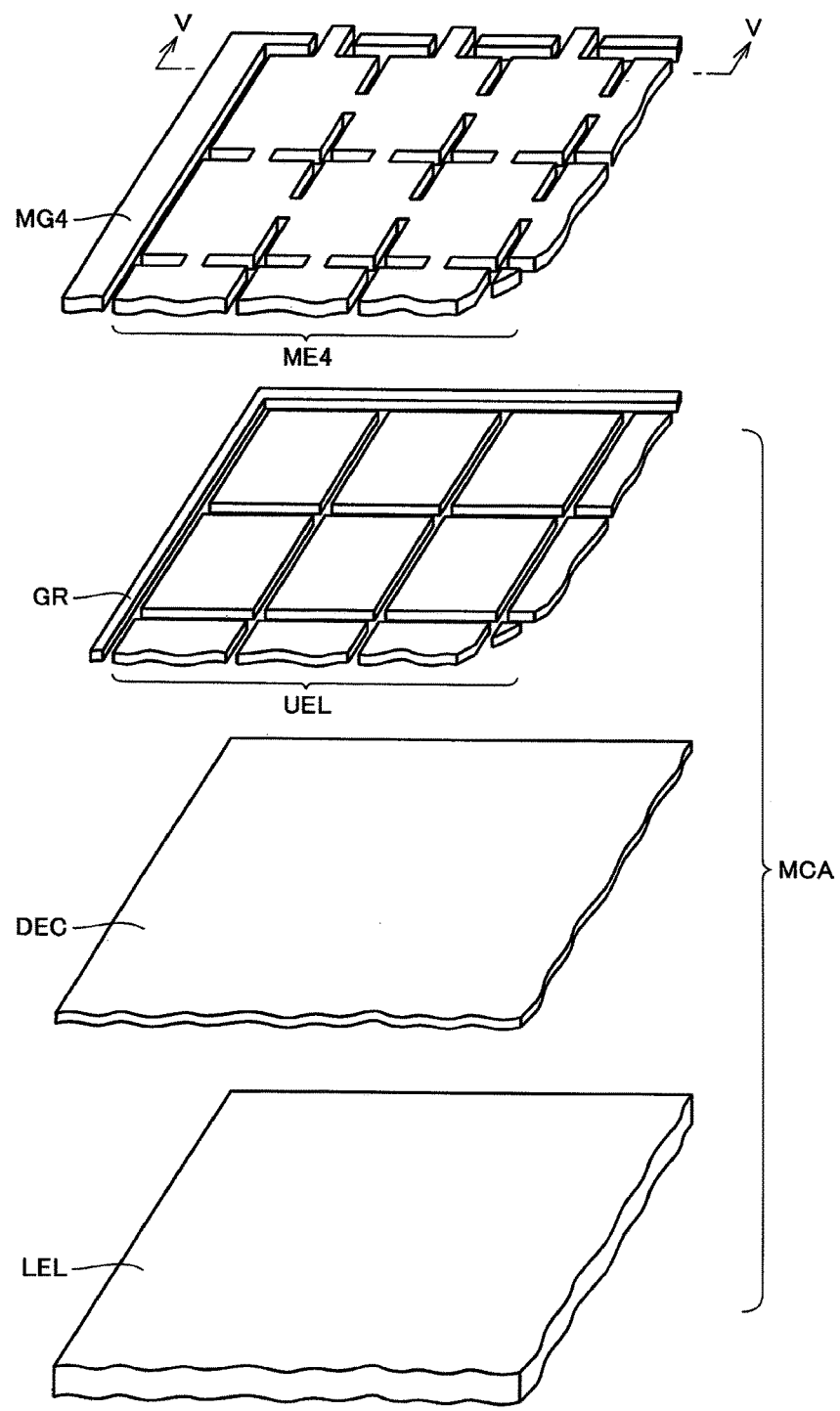
FIG. 4 shows partial cross-sectional perspective views each schematically illustrating a basic structure of the MIM capacitors in the first embodiment.
Figure 5:
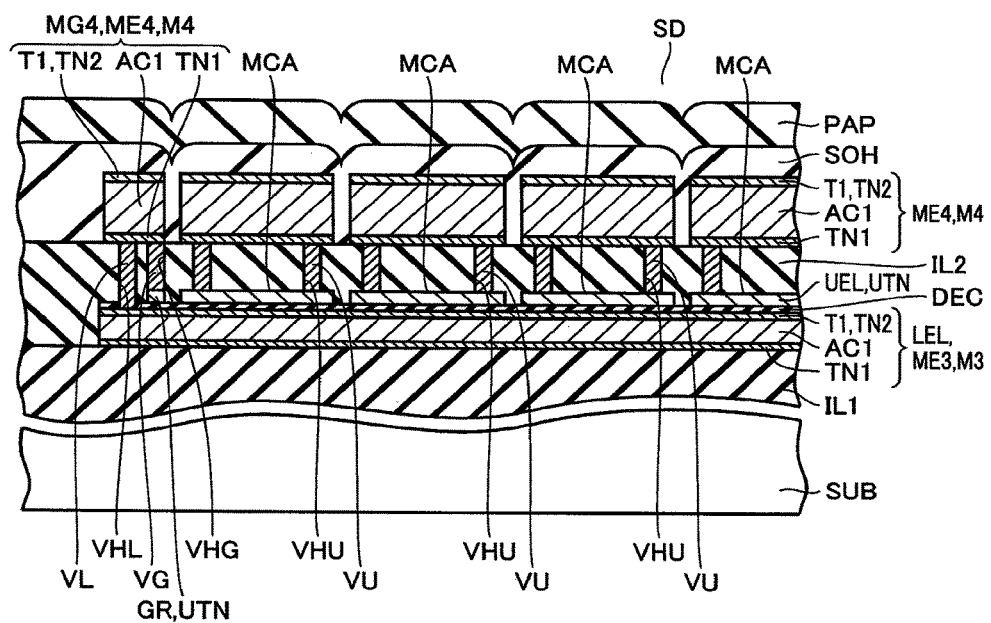
FIG. 5 is a cross-sectional view along a cross-sectional line corresponding to the cross-sectional line V-V shown in FIG. 4 in the first embodiment.

As illustrated in FIGS. 4 and 5, in semiconductor device SD, a metal film ME3 made of the same layer as a metal film M3 serving as the metal interconnect of the third layer corresponds to a plate-shaped lower electrode LEL. Plate-shaped upper electrodes UEL are formed on lower electrode LEL with a dielectric film DEC interposed therebetween. Lower electrode LEL, dielectric film DEC, and upper electrodes UEL constitute MIM capacitors MCA. An interlayer insulating film IL2 is formed to cover MIM capacitors MCA, and a metal film ME4 made of the same layer as a metal film M4 serving as the metal interconnect of the fourth layer is formed on interlayer insulating film IL2.

Figure 6:
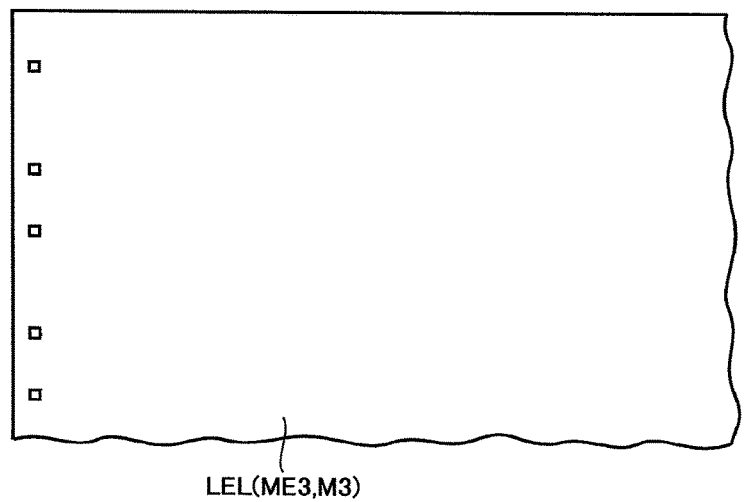
FIG. 6 is a partial plan view illustrating a planar pattern of a lower electrode in the first embodiment.

The structure of MIM capacitors MCA will be described in more detail. FIG. 6 illustrates a planar pattern of lower electrode LEL. Lower electrode LEL is arranged so that a single pattern is opposed to a plurality of patterns of upper electrodes UEL described below. In metal film ME3 to serve as lower electrode LEL, a titanium nitride film TN1 with a thickness of about 20 nm is formed first. An aluminum alloy film AC1 with a thickness of about 300 nm containing aluminum and copper is formed to be in contact with a surface of titanium nitride film TN1. A titanium film T1 with a thickness of about 2.5 nm is formed to be in contact with a surface of aluminum alloy film AC1. A titanium nitride film TN2 with a thickness of about 60 nm is formed to be in contact with a surface of titanium film T1. Note that FIG. 5 illustrates titanium film T1 and titanium nitride film TN2 as a single layer (film), for the sake of simplicity.

Dielectric film DEC is formed to be in contact with a surface of titanium nitride film TN2. Dielectric film DEC is formed of a plasma nitride film with a thickness of about 50 nm, for example. Dielectric film DEC has a planar pattern formed to be the same as the planar pattern of lower electrode ELE.

Figure 7:
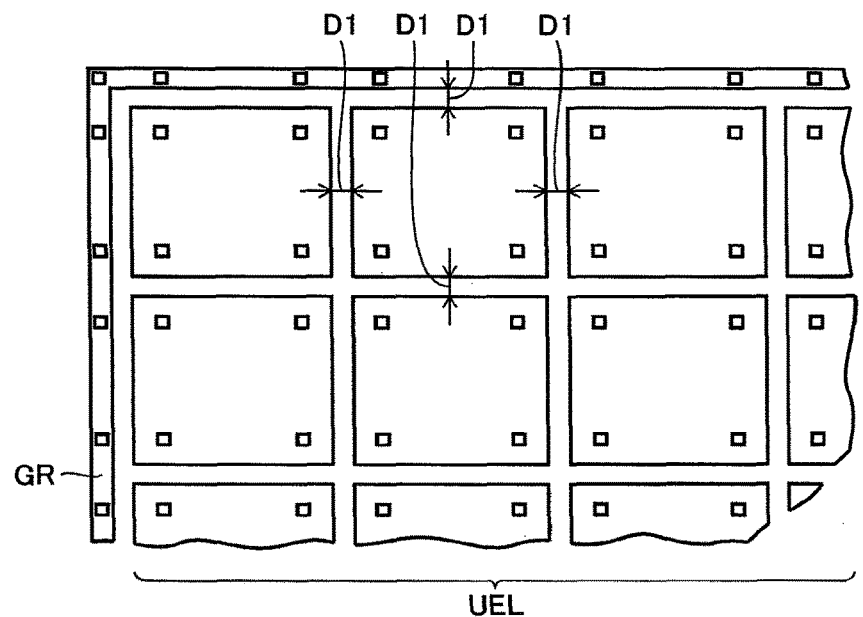
FIG. 7 is a partial plan view illustrating a planar pattern of upper electrodes in the first embodiment.

Upper electrode UEL is formed to be in contact with a surface of dielectric film DEC. Upper electrode UEL is formed of a titanium nitride film with a thickness of about 50 nm, for example. FIG. 7 illustrates a planar pattern of upper electrodes UEL. As illustrated in FIG. 7, a plurality of upper electrodes UEL patterned into squares are arranged in a matrix form (array form) to be opposed to lower electrode LEL. A single upper electrode UEL has a length of 10 μm per side, for example, and the single upper electrode UEL and a portion of lower electrode LEL opposed to upper electrode UEL constitute a capacitor with a capacitance of about 0.14 pF. A prescribed number of square-shaped upper electrodes UEL are arranged to give a required capacitance on a designed circuit.

Note that the planar pattern of MIM capacitors MCA corresponds to the planar pattern of upper electrodes UEL. The square shape of the planar pattern of upper electrodes UEL does not intend to mean a geometrical (mathematical) square, but includes a margin of error in manufacturing. As upper electrodes UEL, an aluminum alloy film or the like, for example, may also be used other than a titanium nitride film, as with metal layer ME3.

Outside upper electrodes UEL positioned on an outermost periphery, a guard ring GR is arranged to surround upper electrodes UEL arranged in a matrix form. Guard ring GR is formed of the titanium nitride film made of the same layer as upper electrodes UEL. One upper electrode UEL and another upper electrode UEL that are adjacent to each other are arranged at an equal distance D1 (about 1.6 μm, for example), without the guard ring being interposed between the one upper electrode UEL and the other upper electrode UEL. Moreover, upper electrodes UEL positioned on the outermost periphery and guard ring GR positioned outside those upper electrodes UEL are arranged at a distance equal to distance D1 from each other. That is, each of the plurality of upper electrodes UEL, including those positioned on the outermost periphery, is set to be at the equal distance D1 from its adjacent pattern (upper electrode UEL or guard ring GR).

As illustrated in FIG. 5, interlayer insulating film IL2 is formed to cover MIM capacitors MCA. Metal film ME4 made of the same layer as metal film M4 to serve as the metal interconnect of the fourth layer is formed to be in contact with a surface of interlayer insulating film IL2. In metal film ME4, a titanium nitride film TN1 with a thickness of about 50 nm is formed first. An aluminum alloy film AC1 with a thickness of about 1000 nm containing aluminum and copper is formed to be in contact with a surface of titanium nitride film TN1. A titanium film T1 with a thickness of about 5 nm is formed to be in contact with a surface of aluminum alloy film AC1. A titanium nitride film TN2 with a thickness of about 20 nm is formed to be in contact with a surface of titanium film T1. Note that FIG. 5 illustrates titanium film T1 and titanium nitride film TN2 as a single layer (film), for the sake of simplicity.

Figure 8:
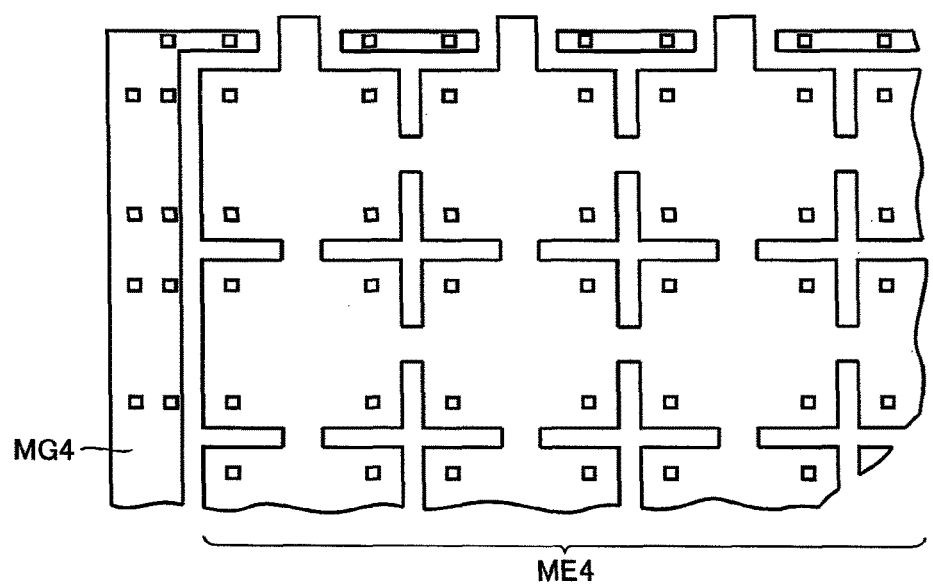
FIG. 8 is a partial plan view illustrating a planar pattern of metal films in the first embodiment.

FIG. 8 illustrates a planar pattern of metal films ME4. As illustrated in FIG. 8, a plurality of metal films ME4 patterned substantially into squares are arranged to be opposed to the respective plurality of upper electrodes UEL of MIM capacitors MCA (see FIG. 4). Each of metal films ME4 is electrically connected to its adjacent metal film ME4 in a central portion of each side thereof. Outside metal films ME4 positioned on the outermost periphery, an outer peripheral metal film MG4 made of the same layer as metal film M4 to serve as the metal interconnect of the fourth layer is formed to surround the plurality of metal films ME4. Outer peripheral metal film MG4 is electrically isolated from metal films ME4.

As illustrated in FIG. 5, a via hole VHU that reaches upper electrode UEL is formed in interlayer insulating film IL2, and a via VU is formed within via hole VHU. Upper electrode UEL and metal film ME4 that are opposed to each other are electrically connected through via VU, and a plurality of MIM capacitors MCA are connected in parallel through metal films ME4 to constitute MIM capacitors MCA with a desired capacitance.

A via hole VHG that reaches guard ring GR is formed in interlayer insulating film IL2, and a via VG is formed within via hole VHG. Guard ring GR is electrically connected to outer peripheral metal film MG4 through via VG. Furthermore, a via hole VHL that reaches lower electrode LEL is formed in interlayer insulating film IL2, and a via VL is formed within via hole VHL. Lower electrode LEL is electrically connected to outer peripheral metal film MG4 through via VL. Guard ring GR is fixed to a prescribed potential through outer peripheral metal film MG4, thereby reducing external noise.

An insulating film SOH of a silicon oxide film, for example, is formed to cover metal films ME4 and outer peripheral metal film MG4. A passivation film PAP such as a silicon nitride film, for example, is formed to be in contact with a surface of insulating film SOH. A principal portion of the semiconductor device with MIM capacitors MCA is configured as described above.

Figure 9:
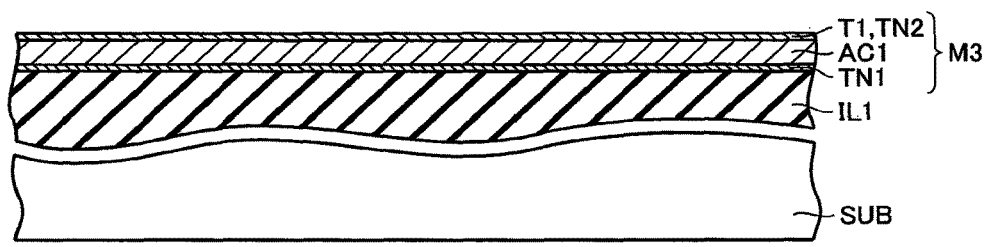
FIG. 9 is a cross-sectional view illustrating one step of a method for manufacturing a semiconductor device in the first embodiment.

A method for manufacturing the above-described semiconductor device with MIM capacitors will be described next. First, a prescribed semiconductor element such as a transistor or the like is formed in a prescribed element formation region on the main surface of a semiconductor substrate. An interlayer insulating film is formed to cover the semiconductor element, and a metal interconnect is formed on the interlayer insulating film. After the interlayer insulating film of the third layer covering the metal interconnect of the second layer has thus been formed, as illustrated in FIG. 9, metal film M3 to serve as a metal interconnect of the third layer is formed to be in contact with a surface of interlayer insulating film IL1. As metal film M3, titanium nitride film TN1 (thickness: about 20 nm), aluminum alloy film AC1 (thickness: about 300 nm), titanium film T1 (thickness: about 2.5 nm), and titanium nitride film TN2 (thickness: about 60 nm) are formed in order.

Figure 10:
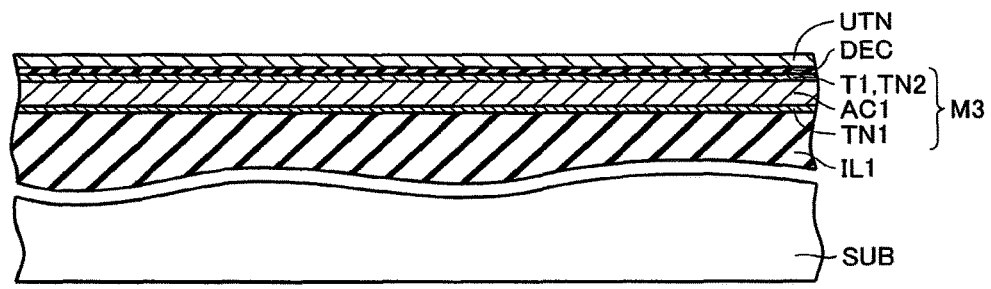
FIG. 10 is a cross-sectional view illustrating a step performed after the step illustrated in FIG. 9 in the first embodiment.
Figure 11:
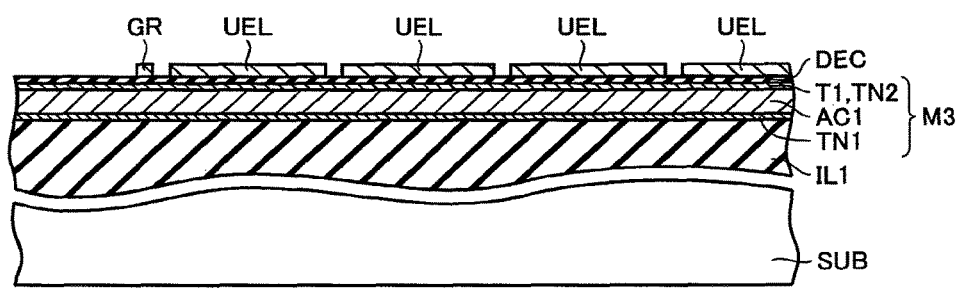
FIG. 11 is a cross-sectional view illustrating a step performed after the step illustrated in FIG. 10 in the first embodiment.

Next, as illustrated in FIG. 10, dielectric film DEC (thickness: about 50 nm) made of a plasma nitride film is formed by a plasma CVD method, for example, to be in contact with a surface of metal film M3. A titanium nitride film UTN (thickness: about 50 nm) to serve as upper electrodes is formed to be in contact with a surface of dielectric film DEC. Next, a resist pattern (not illustrated) for patterning the upper electrodes of the MIM capacitors and the guard ring is formed on titanium nitride film UTN, by performing a prescribed photoengraving process. Titanium nitride film UTN is then etched with the resist pattern as a mask. The resist pattern is subsequently removed. In this way, upper electrodes UEL and guard ring GR are formed, as illustrated in FIG. 11.

At this time, as described above, each of the plurality of upper electrodes UEL is set to be at the equal distance D from its adjacent pattern (upper electrode UEL or guard ring GR), which prevents the formation of upper electrodes UEL having a tapered cross-sectional shape. In this way, a desired cross-sectional shape is achieved for each of the plurality of upper electrodes UEL, thus reducing variations in capacitance as MIM capacitors.

Figure 12:
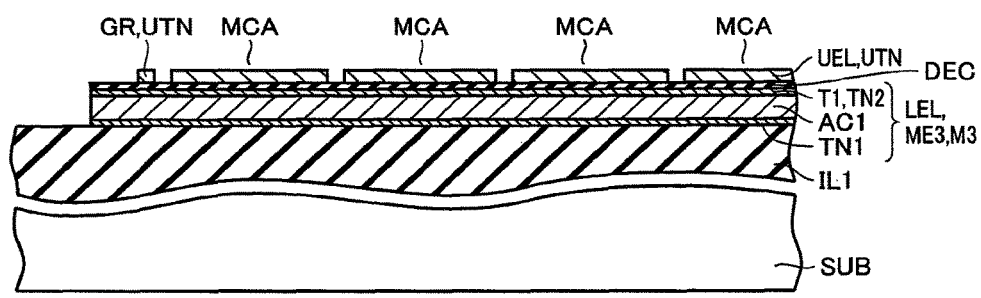
FIG. 12 is a cross-sectional view illustrating a step performed after the step illustrated in FIG. 11 in the first embodiment.

Next, a silicon oxynitride film (not illustrated) with a thickness of about 50 nm is formed as an anti-reflective film (BARL: Bottom Anti-Reflective Layer) to cover metal film M3 and the like. Next, a resist pattern (not illustrated) for patterning the lower electrode is formed on metal film M3, by performing a prescribed photoengraving process. Metal film M3 is then etched with the resist pattern as a mask. The resist pattern is subsequently removed. In this way, lower electrode LEL is formed, as illustrated in FIG. 12. A single MIM capacitor MCA is formed by a single upper electrode UEL, and a portion of dielectric film DEC and a portion of lower electrode LEL each positioned directly below the upper electrode UEL.

Figure 13:
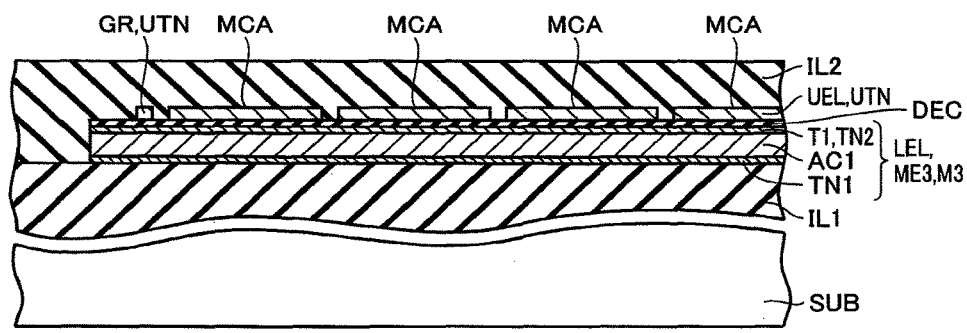
FIG. 13 is a cross-sectional view illustrating a step performed after the step illustrated in FIG. 12 in the first embodiment.

Next, as illustrated in FIG. 13, interlayer insulating film IL2 of the fourth layer is formed to cover MIM capacitors MCA. A resist pattern (not illustrated) for forming a via in interlayer insulating film IL2 is formed by performing a prescribed photoengraving process. By etching interlayer insulating film IL2 with the resist pattern as a mask, via hole VHU that reaches upper electrode UEL, a via hole VG that reaches guard ring GR, and via hole VHL that reaches lower electrode LEL are each formed (see FIG. 14).

A titanium film, a titanium nitride film, and a tungsten film (all not illustrated), for example, are formed on a surface of interlayer insulating film IL2 to fill via holes VHU, VHG, and VHL. Next, a chemical mechanical polishing process (CMP: Chemical Mechanical Polishing) is performed to remove the portion of the tungsten film and the like positioned on an upper surface of interlayer insulating film IL2, leaving the portion of the tungsten film and the like positioned within via holes VHU, VHG, and VHL.

Figure 14:
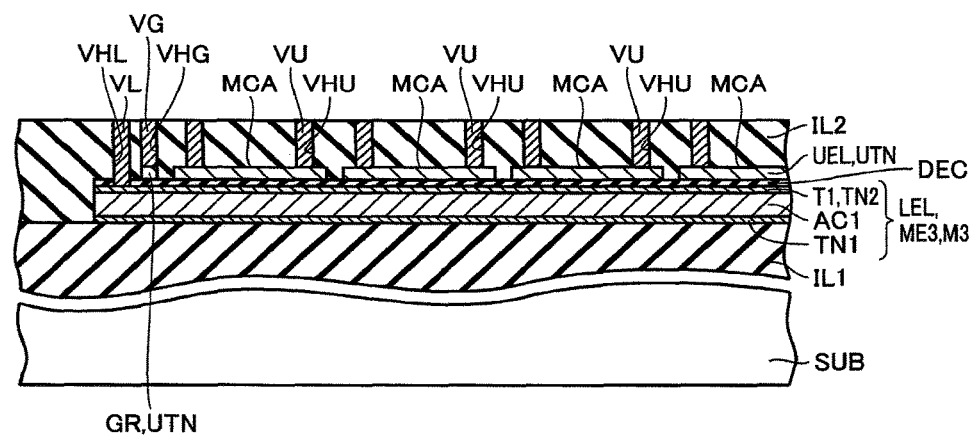
FIG. 14 is a cross-sectional view illustrating a step performed after the step illustrated in FIG. 13 in the first embodiment.

In this way, as illustrated in FIG. 14, via VU that is electrically connected to upper electrode UEL is formed within via hole VHU. Via VG that is electrically connected to guard ring GR is formed within via hole VHG. Via VL that is electrically connected to lower electrode LEL is formed within via hole VHL.

Figure 15:
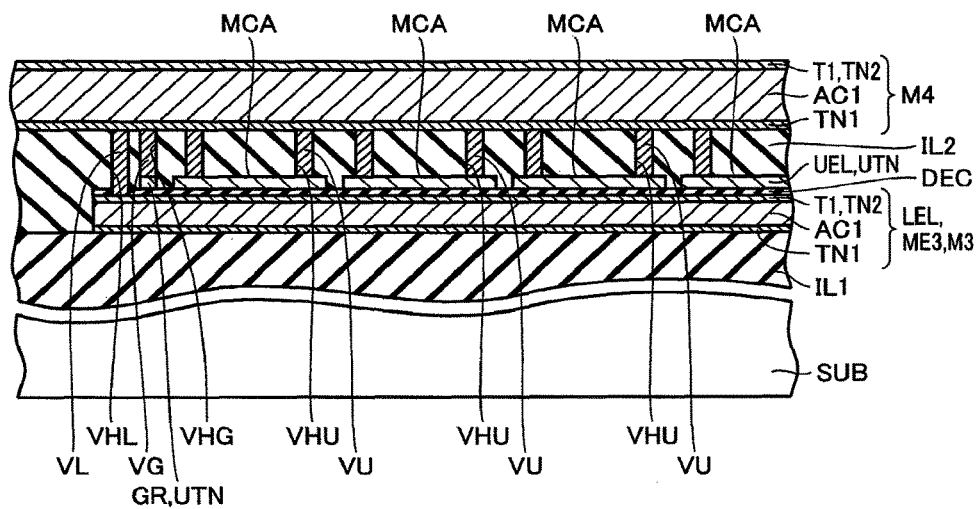
FIG. 15 is a cross-sectional view illustrating a step performed after the step illustrated in FIG. 14 in the first embodiment.

Next, as illustrated in FIG. 15, metal film M4 to serve as a metal interconnect of the fourth layer is formed to be in contact with a surface of interlayer insulating film IL2. As metal film M4, titanium nitride film TN1 (thickness: about 20 nm), aluminum alloy film AC1 (thickness: about 300 nm), titanium film T1 (thickness: about 2.5 nm), and titanium nitride film TN2 (thickness: about 60 nm) are formed in order.

Next, a silicon oxynitride film (not illustrated) with a thickness of about 50 nm is formed as BARL to cover metal film M4 and the like. Next, a resist pattern (not illustrated) for patterning a metal film that is electrically connected to MIM capacitor MCA or guard ring GR, for example, is formed on metal film M4, by performing a prescribed photoengraving process. Metal film M4 is then etched with the resist pattern as a mask. The resist pattern is subsequently removed.

Figure 16:
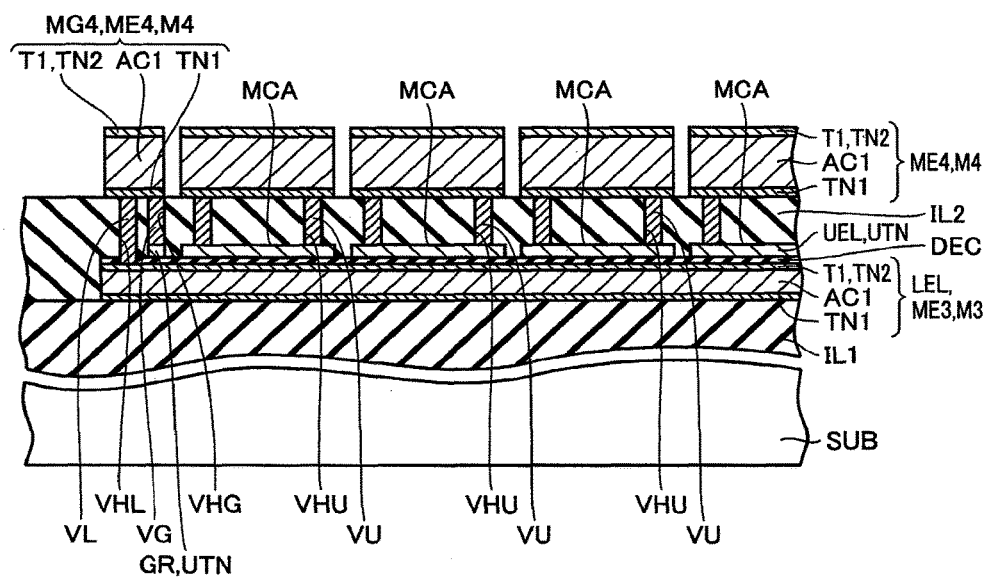
FIG. 16 is a cross-sectional view illustrating a step performed after the step illustrated in FIG. 15 in the first embodiment.

In this way, as illustrated in FIG. 16, metal film ME4 that is electrically connected to upper electrode UEL of MIM capacitor MCA through via VU is formed. Moreover, outer peripheral metal film MG4 that is electrically connected to guard ring GR through via VG is formed. Furthermore, outer peripheral metal film MG4 is electrically connected to lower electrode LEL of MIM capacitor MCA through via VL.

Next, insulating film SOH (see FIG. 4) such as a silicon oxide film is formed to cover metal film ME4 and outer peripheral metal film MG4 by a high-density plasma process, for example. A passivation film PAP (see FIG. 4) such as a silicon nitride film is formed next to cover the insulating film. In this way, principal portions of the semiconductor device with MIM capacitors are formed, as illustrated in FIG. 4.

In the semiconductor device described above, guard ring GR is arranged only outside upper electrodes UEL positioned on the outermost periphery, so as to surround the plurality of upper electrodes UEL, so that leakage current can be decreased, and the footprint of the MIM capacitors can be reduced, as compared to the case of a semiconductor device in which a guard ring is arranged to surround individual upper electrodes UEL (comparative example). This will now be described.

Figure 17:
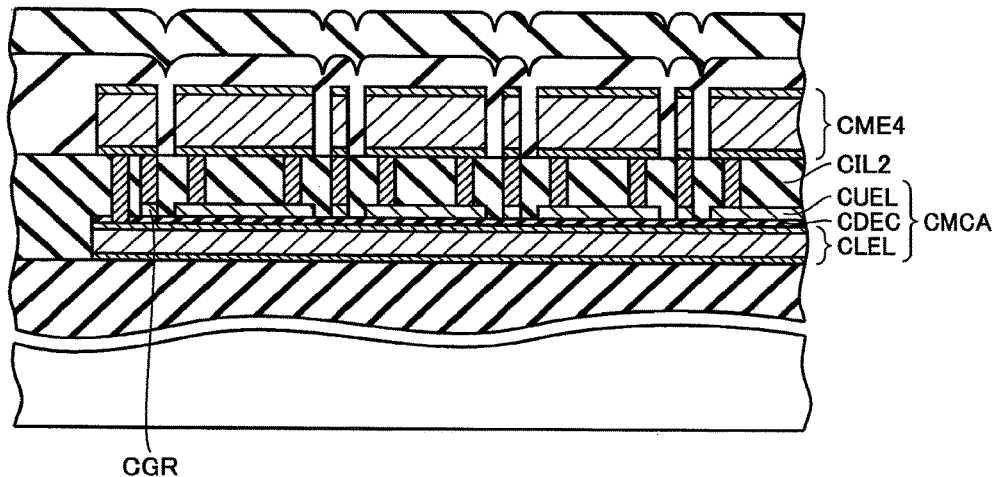
FIG. 17 is a cross-sectional view of a semiconductor device according to a comparative example.
Figure 18:
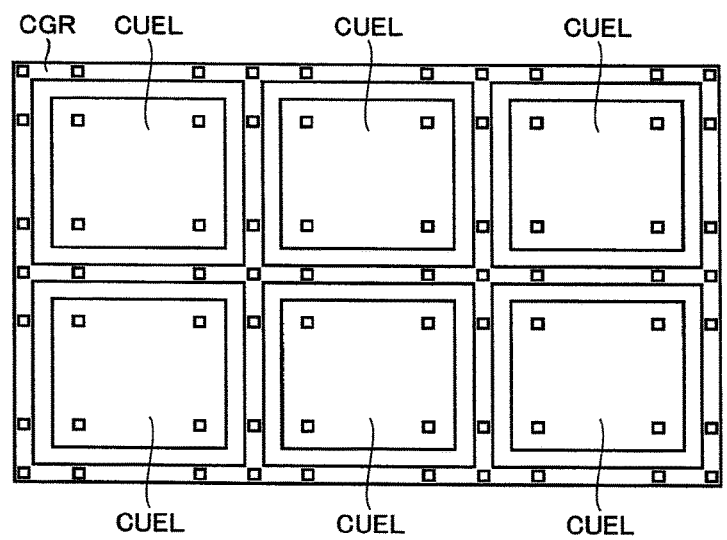
FIG. 18 is a plan view illustrating upper electrodes of MIM capacitors of the semiconductor device according to the comparative example.
Figure 19:
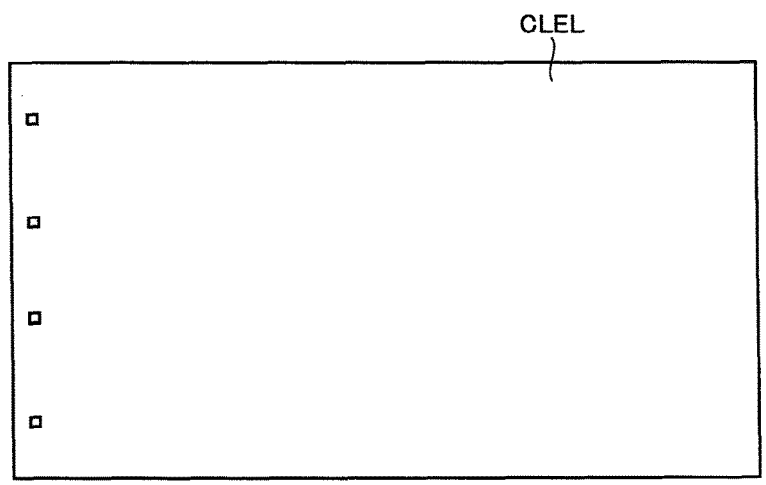
FIG. 19 is a plan view illustrating a lower electrode of the MIM capacitors of the semiconductor device according to the comparative example.
Figure 20:
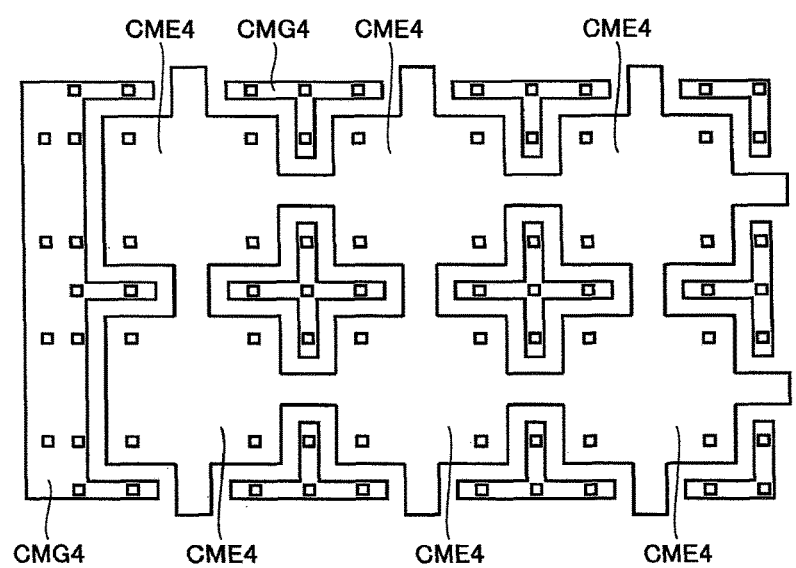
FIG. 20 is a plan view illustrating metal films of the semiconductor device according to the comparative example.

As illustrated in FIG. 17, in the semiconductor device according to the comparative example, upper electrodes CUEL are formed on a lower electrode CLEL with a dielectric film CDEC interposed therebetween. Lower electrode CLEL, dielectric film CDEC, and upper electrodes CUEL constitute MIM capacitors CMCA. An interlayer insulating film CIL2 is formed to cover MIM capacitor CMCA, and a metal film CME4 is formed on interlayer insulating film CIL2. FIG. 18 illustrates a planar pattern of upper electrodes CUEL, and FIG. 19 illustrates a planar pattern of lower electrode CLEL. FIG. 20 illustrates a planar pattern of metal films CME4.

As illustrated in FIG. 18, in upper electrodes CUEL of MIM capacitors CMCA, a guard ring CGR is arranged to surround each of a plurality of square upper electrodes CUEL that are arranged in a matrix form. Lower electrode CLEL illustrated in FIG. 19 is arranged so that a single pattern is opposed to patterns of upper electrodes CUEL and guard ring CGR. Upper metal films CME4 illustrated in FIG. 20 are arranged to be opposed to respective upper electrodes CUEL of MIM capacitors CMCA, and outer peripheral metal film CMG4 is arranged to be opposed to guard ring CGR.

Guard ring CGR is fixed to a certain potential in order to suppress external noise. If there is a difference in potential between guard ring CGR and MIM capacitors CMCA, leakage current occurs. For example, where guard ring CGR is fixed to ground potential and the potential of MIM capacitors CMCA is higher than ground potential, leakage current occurs from MIM capacitors CMCA to guard ring CGR.

In MIM capacitors CMCA according to the comparative example, since guard ring CGR is arranged to surround each of the plurality of upper electrodes CUEL, it is assumed, for example, that leakage current (linear component leakage current) may easily occur from MIM capacitors CMCA to guard ring CGR. Moreover, since such guard ring CGR is arranged, it is assumed that the footprint of MIM capacitors CMCA cannot be easily reduced.

In comparison with the semiconductor device according to the comparative example, in the semiconductor device according to the present embodiment, guard ring GR is arranged only outside upper electrodes UEL positioned on the outermost periphery, so as to surround the plurality of upper electrodes UEL, rather than being arranged to surround individual upper electrodes UEL.

This substantially reduces a total extension of guard ring GR, as compared with the semiconductor device according to the comparative example. That is, the linear component can be reduced as guard ring GR. Consequently, leakage current between MIM capacitors and guard ring GR such as leakage current from MIM capacitors to guard ring GR, can be substantially reduced, thus ensuring the reliability against time dependent dielectric breakdown (TDDB), for example.

Moreover, a guard ring is not arranged to surround individual upper electrodes UEL, thus resulting in a shortened distance between individual upper electrodes UEL. Consequently, the footprint of MIM capacitors MCA can be reduced.

Furthermore, guard ring GR is arranged outside upper electrodes UEL positioned on the outermost periphery. Furthermore, the distance between guard ring GR and upper electrodes UEL positioned on the outermost periphery is set to be equal to the distance between upper electrodes UEL positioned inside and adjacent to each other.

In this way, at the time of patterning the upper electrodes using a prescribed photoengraving process and an etching process, the finished cross-sectional shape of the upper electrodes positioned on the outermost periphery is prevented from becoming a tapered shape, and upper electrodes with desired dimensions are formed by upper electrodes UEL positioned on the outermost periphery and upper electrodes UEL positioned inside. Consequently, variations in capacitance as MIM capacitors MCA are reduced to thereby achieve MIM capacitors with high precision.

Figure 21:
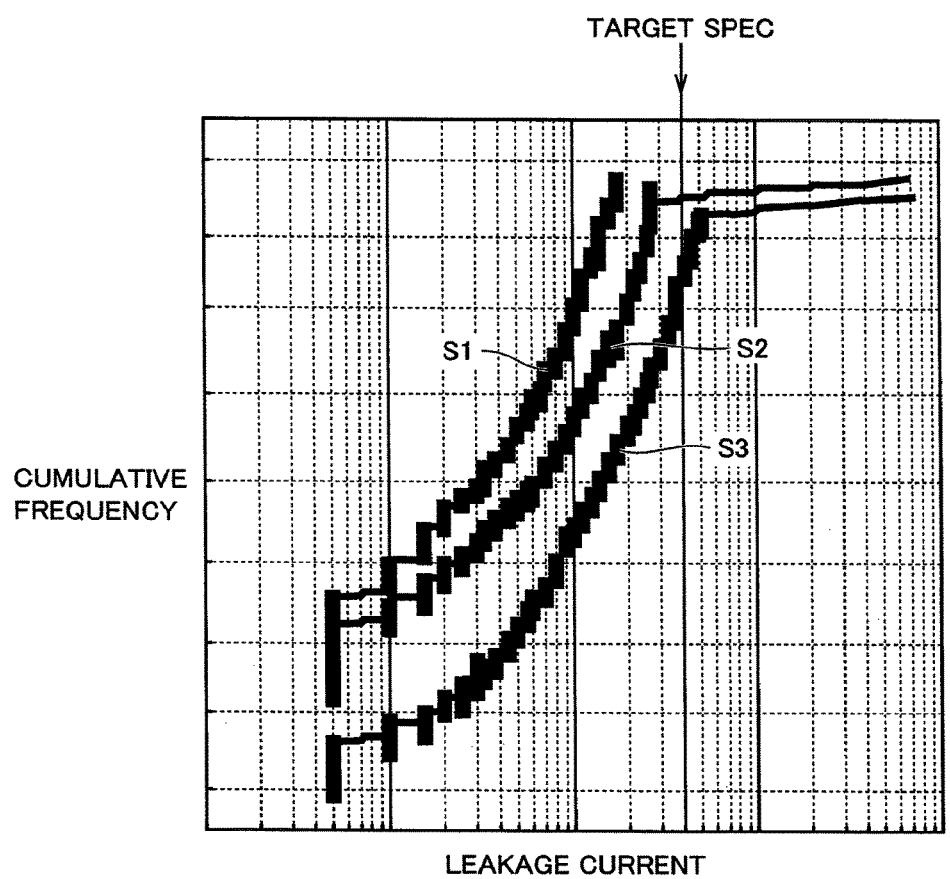
FIG. 21 shows graphs each representing the relationship between leakage current and cumulative frequency as a result of evaluating leakage current in the first embodiment.

Here, evaluations of leakage current of MIM capacitors performed by the inventors will be described. FIG. 21 shows graphs each representing results of evaluation of leakage current, in which the horizontal axis indicates leakage current, and the vertical axis indicates cumulative frequency. In FIG. 21, graph S1 shows results of evaluation of the semiconductor device according to the above-described embodiment, and graph S2 shows results of evaluation of the semiconductor device according to the above-described comparative example. Graph S3 shows, as another comparative example, results of evaluation of a semiconductor device in which a guard ring is arranged to surround individual upper electrodes UEL, and a dielectric film is patterned to match the pattern of the upper electrodes.

A comparison of graph S1 and graph S2 has revealed that in the semiconductor device according to the present embodiment (graph S1), leakage current was reduced to about one-third of that in the semiconductor device according to the comparative example (graph S2), because of the absence of the linear component due to the inside guard ring. Moreover, a comparison of graph S1 and graph S3 has revealed that in the semiconductor device according to the present embodiment (graph S1), leakage current decreased to about a single-digit number, as compared with the semiconductor device according to the other comparative example (graph S3) having the patterned dielectric film. It has also been revealed that in the semiconductor device according to the other comparative example (graph S3), target spec is not satisfied. As described above, it has been demonstrated that in the semiconductor device according to the present embodiment, leakage current of the MIM capacitors can be significantly reduced, as compared with the semiconductor devices according to the comparative example and the other comparative example.

Second Embodiment

With regard to the foregoing semiconductor device, the MIM capacitors each including, as an upper electrode of a single MIM capacitor, the square upper electrode having a length of about 10 μM per side, have been described by way of example. In this case, the capacitance per single MIM capacitor is 0.14 pF, for example. A greater capacitance may be needed depending on the electronic device to which the semiconductor device is applied.

Here, as an MIM capacitor having a capacitance 10 times greater (1.4 pF) than the above-described capacitance per single MIM capacitor, MIM capacitors each including a square upper electrode having a length of about 32 μm per side will be described by way of example.

Figure 22:
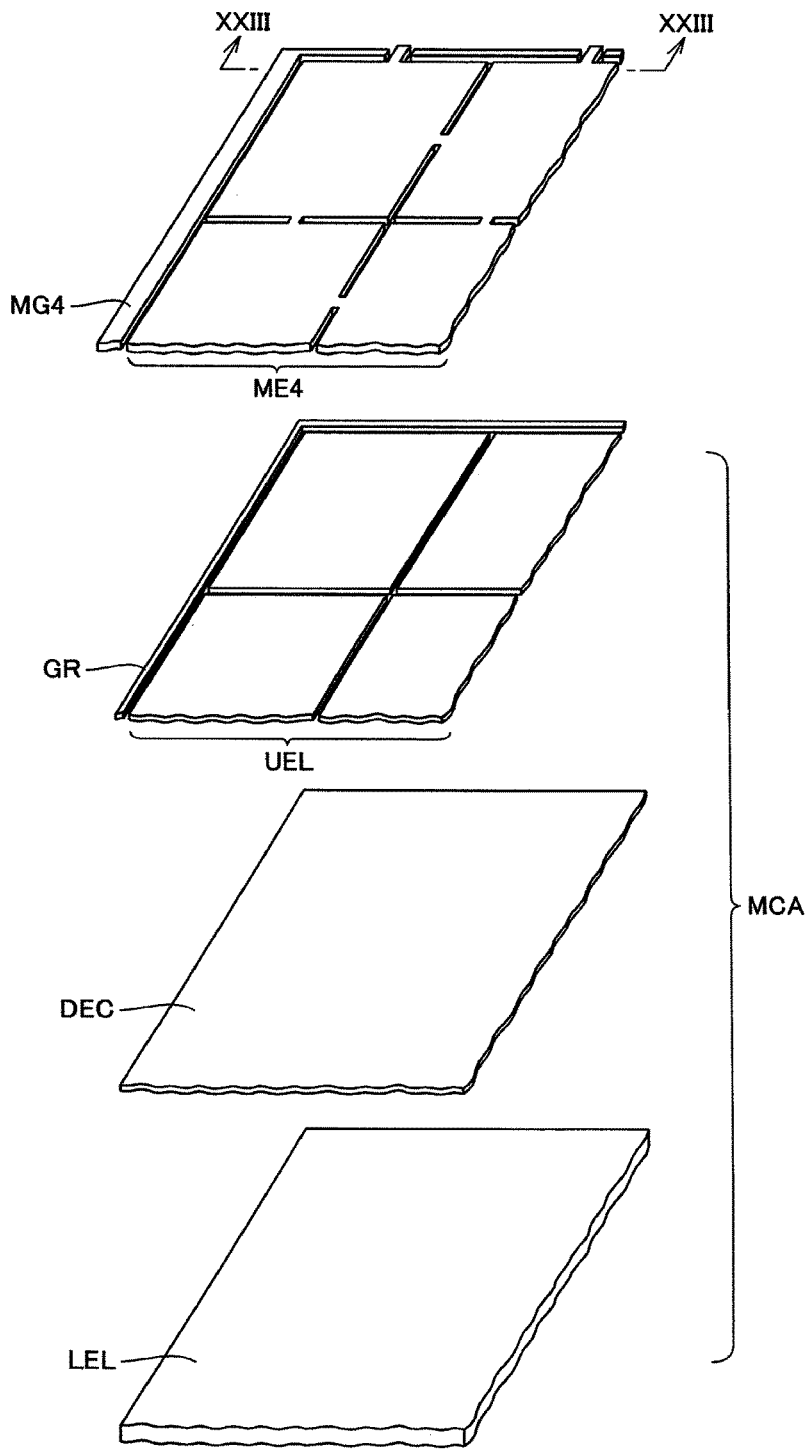
FIG. 22 shows partial cross-sectional perspective views each schematically illustrating a basic structure of MIM capacitors of a semiconductor device according to a second embodiment of the present invention.
Figure 23:
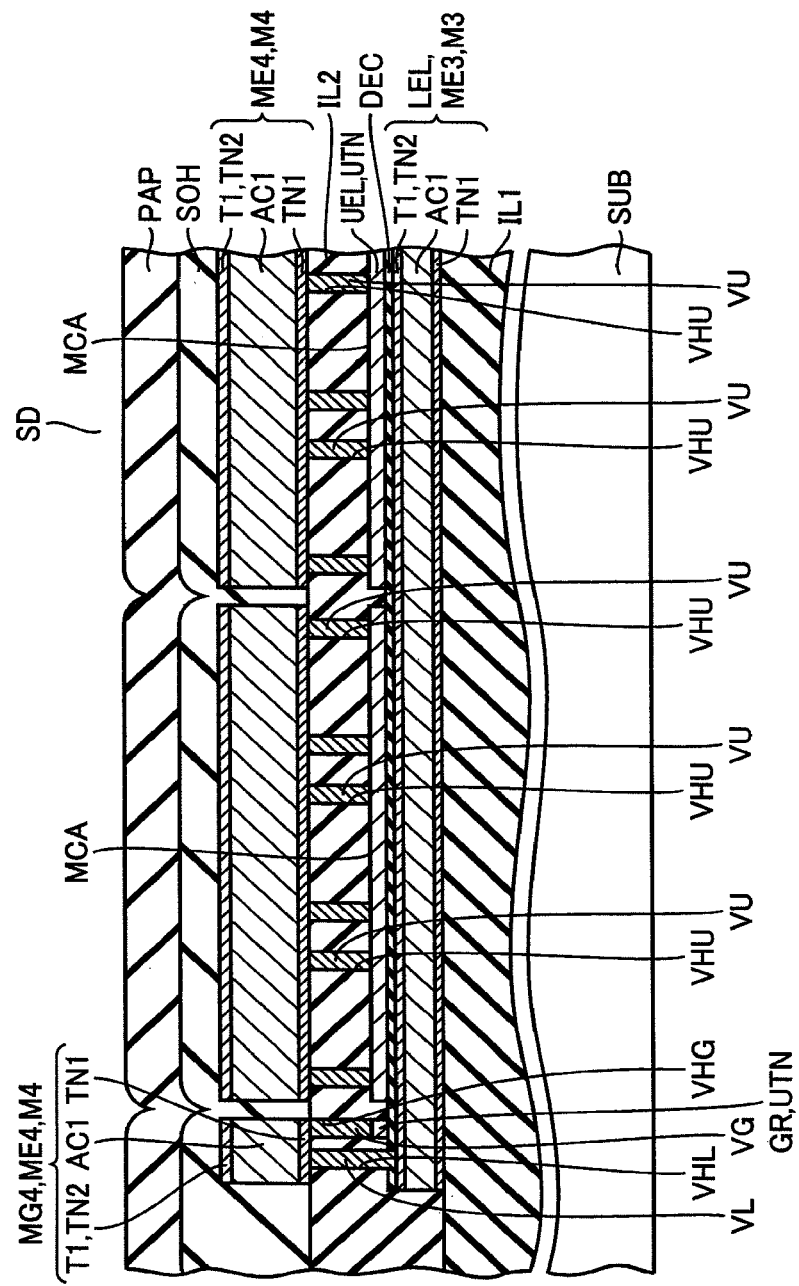
FIG. 23 is a cross-sectional view along a cross-sectional line corresponding to the cross-sectional line XXIII-XXIII shown in FIG. 22 in the second embodiment.
Figure 24:
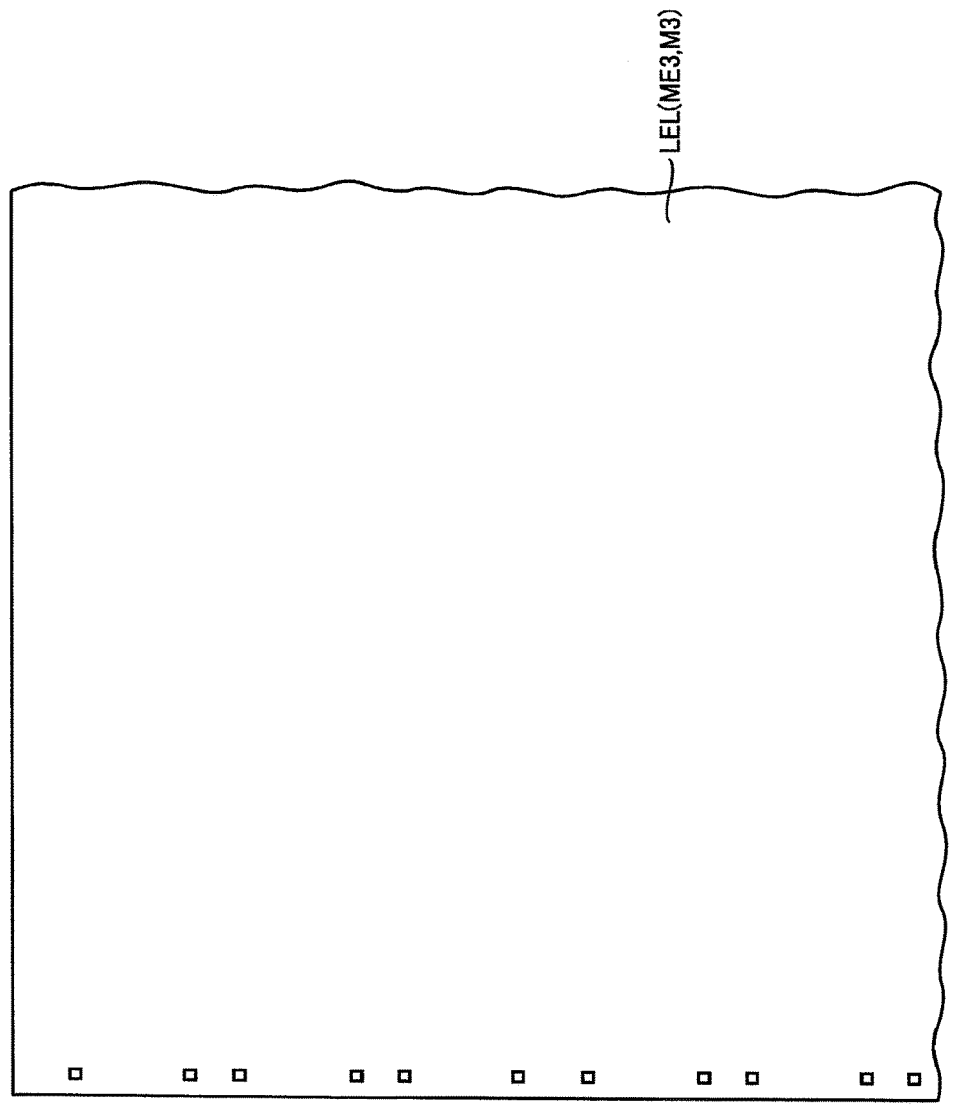
FIG. 24 is a partial plan view illustrating a planar pattern of a lower electrode in the second embodiment.
Figure 25:
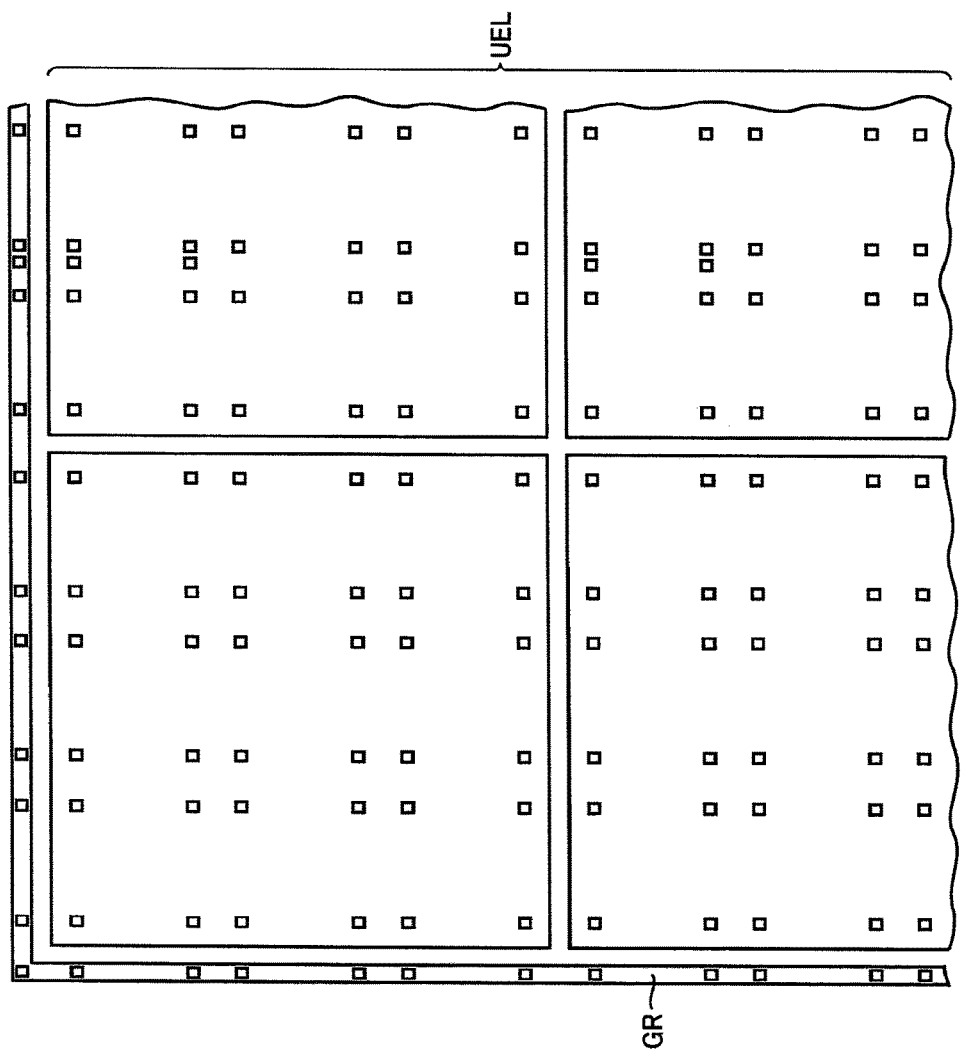
FIG. 25 is a partial plan view illustrating a planar pattern of upper electrodes in the second embodiment.
Figure 26:
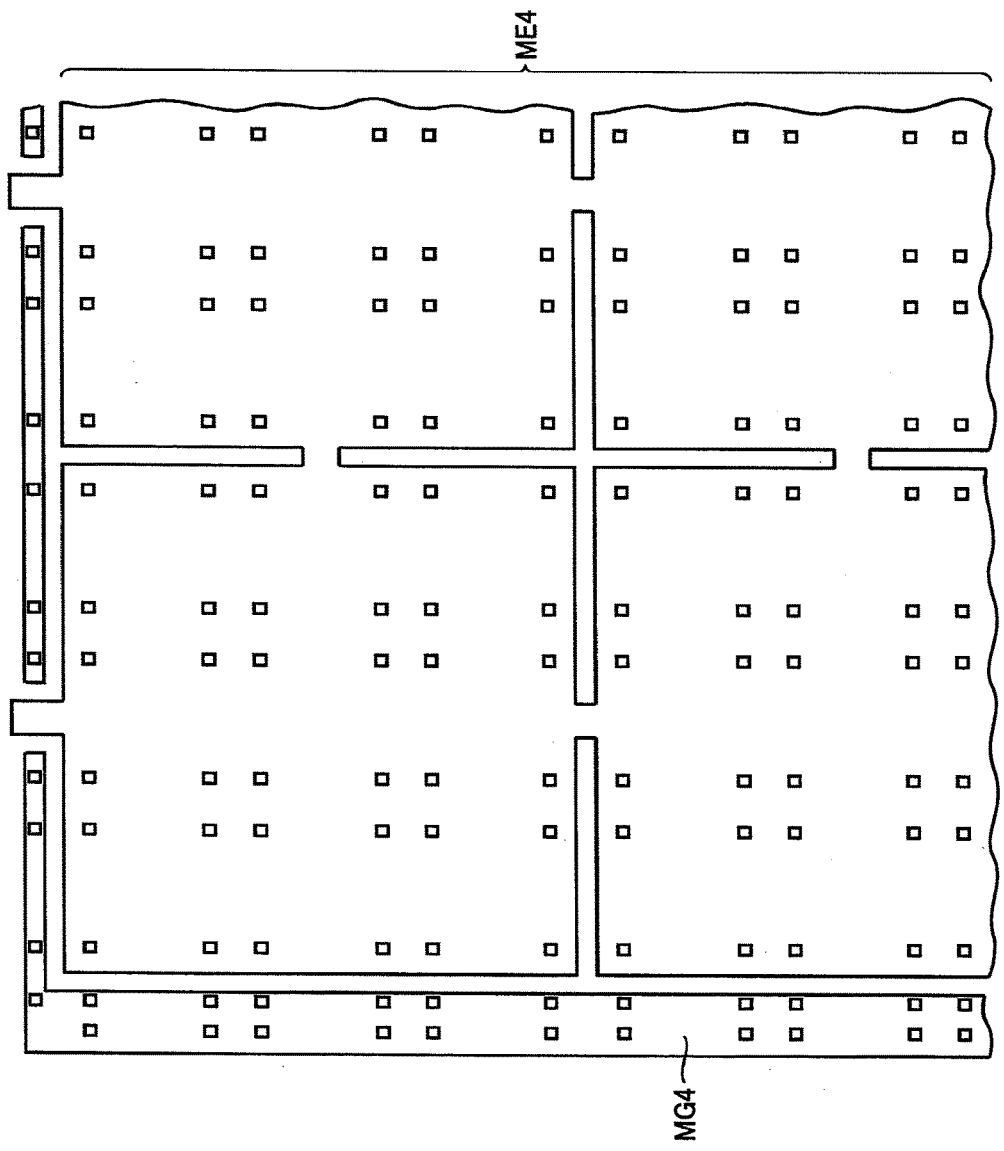
FIG. 26 is a partial plan view illustrating a planar pattern of metal films in the second embodiment.

As illustrated in FIGS. 22 and 23, lower electrode LEL is formed of metal film ME3. Upper electrode UEL and guard ring GR are formed on lower electrode LEL with dielectric film DEC interposed therebetween. Lower electrode LEL, dielectric film DEC, and upper electrode UEL constitute an MIM capacitor MCA. Interlayer insulating film IL2 is formed to cover MIM capacitors MCA, and metal film ME4 and outer peripheral metal film MG4 are formed on interlayer insulating film IL2. FIG. 24 illustrates a planar pattern of lower electrode LEL. FIG. 25 illustrates a planar pattern of upper electrodes UEL and guard ring GR. FIG. 26 illustrates a planar pattern of metal films ME4 and the outer peripheral metal film.

The semiconductor device of the present embodiment is basically the same in structure as the above-described semiconductor device (see FIGS. 4 and 5), except that metal films ME4 and the outer peripheral metal film are patterned to match the size of upper electrodes UEL (length per side=32 μm), and the method for manufacturing the semiconductor device is also substantially the same as the method for manufacturing the semiconductor device described above (see FIGS. 9 to 16). Thus, the same components as those in the above-described semiconductor device are denoted by the same reference characters, and the description thereof will not be repeated.

In the semiconductor device described above, guard ring GR is arranged only outside upper electrodes UEL positioned on the outermost periphery, so as to surround the plurality of upper electrodes UEL. In this way, as described for the semiconductor device according to the first embodiment, leakage current and the footprint of the MIM capacitors can be reduced, as compared to the case of the semiconductor device in which the guard ring is arranged to surround individual upper electrodes UEL (comparative example).

Furthermore, if the capacitance (the opposing area of an upper electrode and a lower electrode) of MIM capacitors MCA is the same, the greater the capacitance of a single MIM capacitor is, the shorter the distance of guard ring GR can be, thereby contributing to reduction in leakage current (linear component). Note that the second embodiment has described by way of example the MIM capacitors having a capacitance 10 times greater (1.4 pF) than the capacitance (0.14 pF) per single MIM capacitor described in the first embodiment; however, in order to further obtain MIM capacitors having a capacitance 100 times greater (14 pF) than that capacitance, a single MIM capacitor may have a square upper electrode having a length of about 100 μm per side.

In MIM capacitors, as the area of a single MIM capacitor increases, planarity is required for the interlayer insulating film through which a via is formed. As stated above, a via is formed by subjecting a tungsten film or the like formed on a surface of the interlayer insulating film to fill a via hole, to a chemical mechanical polishing process. Planarization of the interlayer insulating film thus requires planarity obtained by the chemical mechanical polishing process.

If the area of a single MIM capacitor increases and the planarity obtained by the chemical mechanical polishing process deteriorates, a resolution margin (depth of focus) will be required in the photoengraving process at the time of forming a metal interconnect and the like on the interlayer insulating film. There is, therefore, a limit in terms of manufacturing process to increasing the area of a single MIM capacitor, and thus, an MIM capacitor whose upper electrode has a size of approximately 5 μm to 1000 μm per side is desirable in terms of manufacturing process.

Note that as MIM capacitors formed on a single semiconductor device (semiconductor chip), an MIM capacitor whose upper electrode has a size of 10 μm×10 μm may be formed on one circuit block, and an MIM capacitor whose upper electrode has a size of 100 μm×100 μm may be formed on another circuit block; therefore, MIM capacitors (upper electrodes) having different sizes may be present together on a single semiconductor device, so long as required specs (leakage current, circuit block area, and the like) are met for each circuit.

(Planar Pattern and Layout Pattern of MIM Capacitors)

In each of the embodiments described above, the square upper electrode has been described as an example of the planar pattern of the upper electrode of a single MIM capacitor (the planar pattern of the MIM capacitor). In MIM capacitors MCA in which a plurality of upper electrodes are arranged, guard ring GR is arranged outside MIM capacitors MCA positioned on the outermost periphery to surround all of the plurality of MIM capacitors MCA (see FIGS. 7 and 25, and the like). The length of guard ring GR is desirably shorter, from the standpoint of suppressing leakage current (linear component) caused by a difference in potential between MIM capacitors MCA and guard ring GR.

Figure 27:
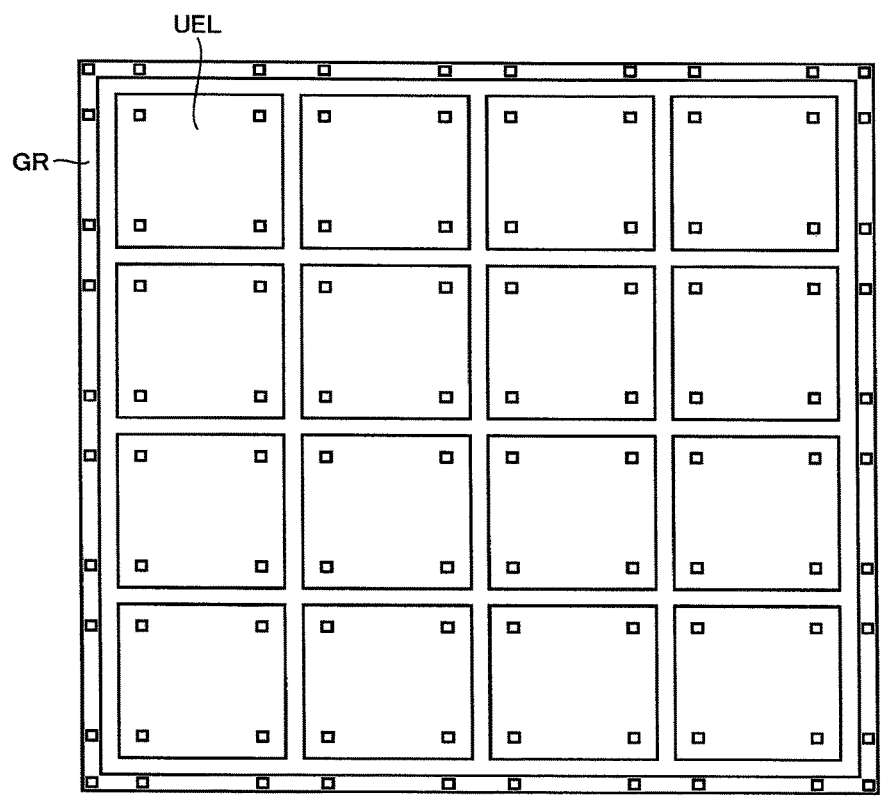
FIG. 27 is a plan view illustrating a planar pattern of MIM capacitors of a semiconductor device according to a first modification in each of the embodiments.

In the MIM capacitors having a square planar pattern of upper electrodes, therefore, as illustrated in FIG. 27, it is desired to arrange upper electrodes UEL in a matrix form (or in an array form) so that the number of rows and columns becomes the same, for example. By adopting a substantially square planar pattern as the entire planar pattern (contour pattern) of the plurality of upper electrodes UEL arranged, it is possible to make shortest the length of guard ring GR that surrounds the plurality of upper electrodes UEL.

Figure 28:
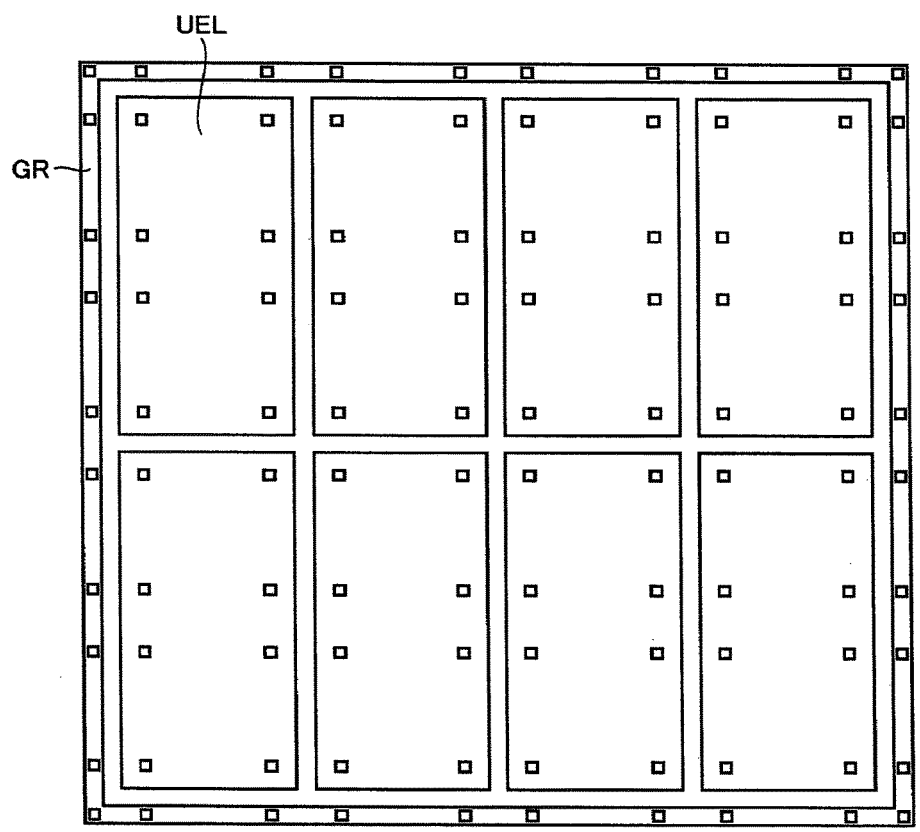
FIG. 28 is a plan view illustrating a planar pattern of MIM capacitors of a semiconductor device according to a second modification in each of the embodiments.

On the other hand, where the planar pattern of the upper electrode of a single MIM capacitor is a rectangle, it is desired to arrange the plurality of upper electrodes so that the entire planar pattern of the plurality of upper electrodes arranged becomes close to a square. In this case, as illustrated in FIG. 28, the entire planar pattern of the plurality of upper electrodes UEL can be close to a square, by arranging MIM capacitors so that the number of MIM capacitors arranged with their longer sides opposed to each other becomes greater than the number of MIM capacitors arranged with their shorter sides opposed to each other. The length of guard ring GR can be made shorter by making the entire planar pattern close to a square.

Figure 29:
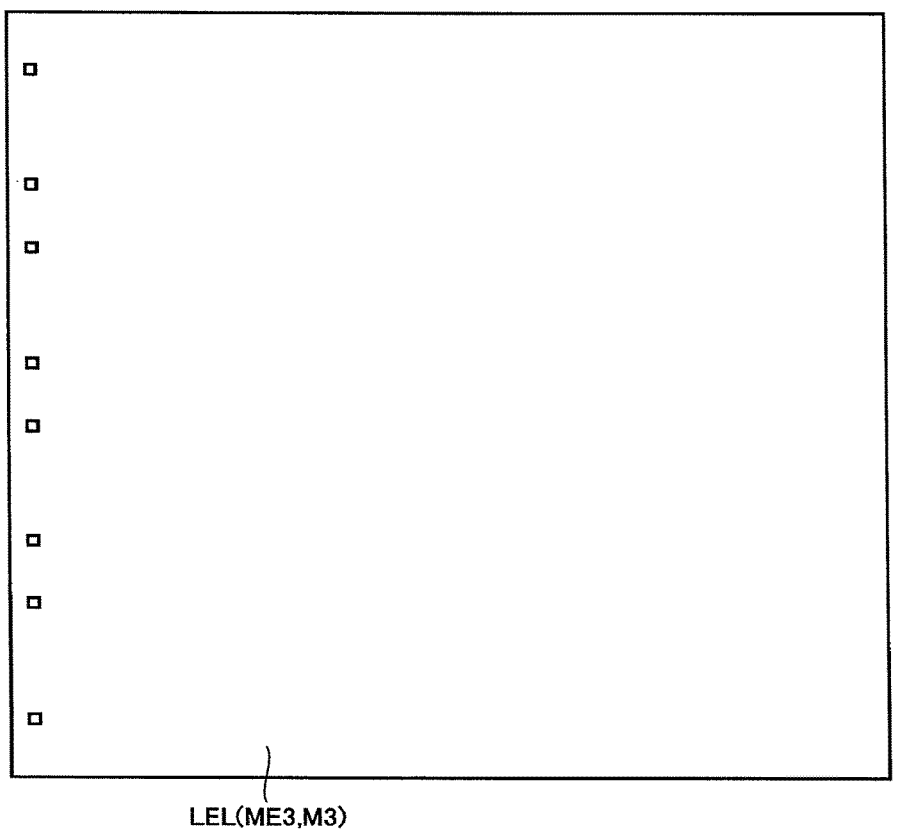
FIG. 29 is a plan view illustrating a lower electrode of the semiconductor device according to the second modification in each of the embodiments.
Figure 30:
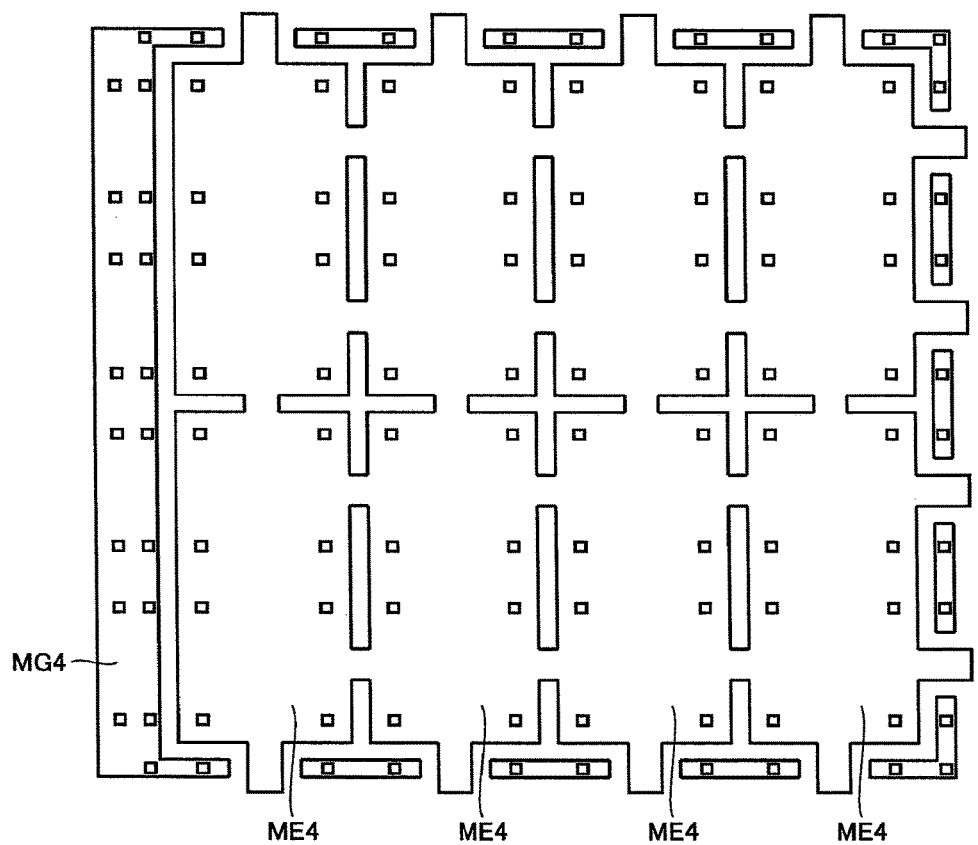
FIG. 30 is a plan view illustrating metal films of the semiconductor device according to the second modification in each of the embodiments.

FIG. 29 illustrates a planar pattern of lower electrode LEL in the case of these MIM capacitors, and FIG. 30 illustrates a planar pattern of metal films ME4 and outer peripheral metal film MG4. Lower electrode LEL illustrated in FIG. 29 is arranged so that a single pattern is opposed to the plurality of upper electrodes UEL. Metal film ME4 illustrated in FIG. 30 is arranged to be opposed to each of the plurality of upper electrodes UEL, and outer peripheral metal film MG4 is arranged to be opposed to guard ring GR.

Figure 31:
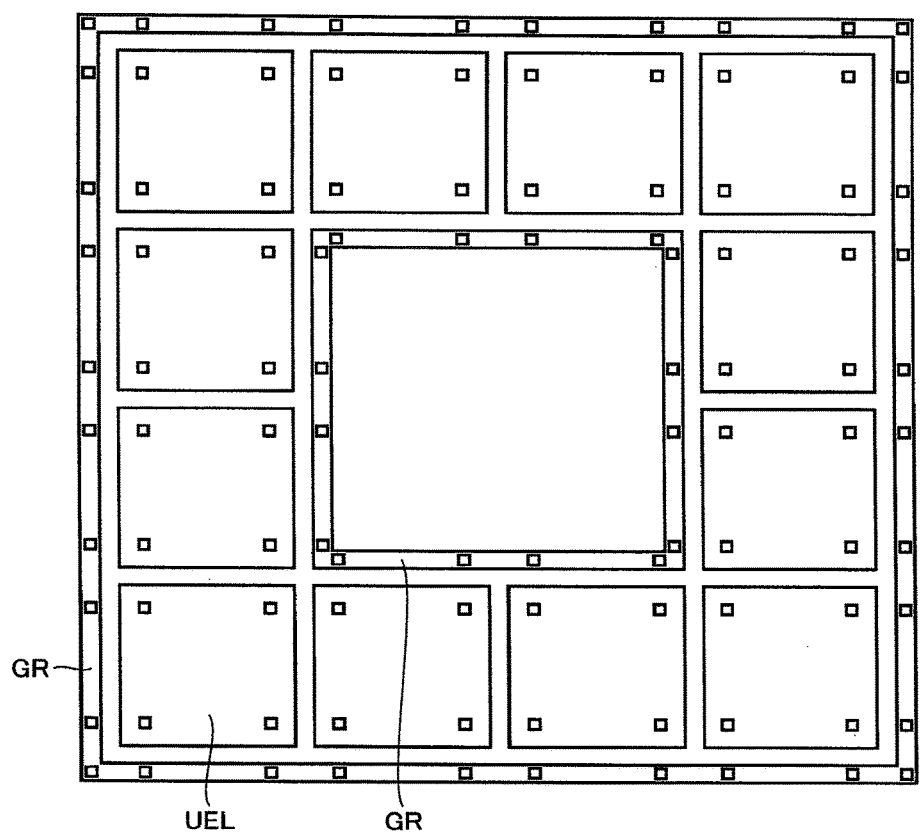
FIG. 31 is a plan view illustrating a planar pattern of MIM capacitors of a semiconductor device according to a third modification in each of the embodiments.

The entire planar pattern of the lower electrode may also be an annular (or a doughnut-shaped) planar pattern, as illustrated in FIG. 31, other than a square or a rectangle. In this case, in order to ensure the precision of patterning of the upper electrodes, guard ring GR is also arranged inside upper electrodes UEL. By making the entire planar pattern annular-shaped, it is possible to reduce the length of the guard ring to some extent, as compared to the case in which upper electrodes UEL are arranged in columns, thereby contributing to reduction in leakage current.

Note that with regard to the foregoing semiconductor device, the case where the MIM capacitors are arranged between the metal interconnect of the third layer and the metal interconnect of the fourth layer has been described by way of example; however, the position in which the MIM capacitors are arranged is not limited to the position between the metal interconnect of the third layer and the metal interconnect of the fourth layer. For example, in a semiconductor device in which a metal interconnect of a fifth layer is formed, NIN capacitors may be arranged between the metal interconnect of the fifth layer and the metal interconnect of the fourth layer thereunder. Moreover, in a semiconductor device in which a metal interconnect of a sixth layer is formed, MIM capacitors may be arranged between the metal interconnect of the sixth layer and the metal interconnect of the fifth layer thereunder. To facilitate the formation of MIM capacitors, the MIM capacitors are desirably arranged between the metal interconnect of the uppermost layer and the metal interconnect of a layer thereunder.

Furthermore, during the formation of aluminum alloy film AC1 that forms a part of the lower electrode, aluminum alloy film AC1 may be reflowed by maintaining, at a prescribed temperature, a semiconductor substrate on which the aluminum alloy film has been formed. Reflowing aluminum alloy film AC1 allows a surface of aluminum alloy film AC1 to be planarized, which reduces variations in the thickness of each prescribed film that forms an individual MIM capacitor MCA, and hence, variations in the capacitance of MIM capacitors MCA.

Although a digital camera has been described as an example of an electronic device to which a semiconductor device with MIM capacitors is applied, the electronic device to which the semiconductor device of the present invention is applied is not limited to a digital camera, and may also be another electronic device.

INDUSTRIAL APPLICABILITY

The present invention is effectively utilized in a semiconductor device with MIM capacitors.

REFERENCE SIGNS LIST

SUB: semiconductor substrate; IL1: interlayer insulating film; M3: metal film; ME3: metal film; TN1: titanium nitride film; AC1: aluminum alloy film; T1: titanium film; TN2: titanium nitride film; LEL: lower electrode; DEC: dielectric film; UEL: upper electrode; UTN: titanium nitride film; GR: guard ring; IL2: interlayer insulating film; VHU: via hole; VHG: via hole; VHL: via hole; VU: via; VG: via; VL: via; M4: metal film; ME4: metal film; MG4: outer peripheral metal film; SOH: insulating film; PAP: passivation film; MCA: MIM capacitor; DC: digital camera; LEZ: lens; RL: image sensing element; AFE: analog front end circuit; ISP: image sensor processor; SD: semiconductor device.

The invention claimed is:
1. A semiconductor device comprising:
a semiconductor substrate having a main surface;
a plurality of MIM capacitors arranged in a prescribed region on said main surface of the semiconductor substrate;
said plurality of MIM capacitors each including:
  a single plate-shaped lower electrode;
  a dielectric film in contact with a top surface of said lower electrode and formed in a same single plate-shaped pattern as said lower electrode; and
  a plurality of plate-shaped upper electrodes arranged in a matrix form and in contact with a top surface of said dielectric film; and
a guard ring arranged to continuously surround all of the plurality of MIM capacitors without branching, wherein the plurality of MIM capacitors are arranged spaced apart from each other by a prescribed distance, and wherein the guard ring is arranged spaced apart from an outermost MIM capacitor by a distance which is the same as the prescribed distance.

2. The semiconductor device according to claim 1, wherein a planar pattern of each of the plurality of MIM capacitors is a square.

3. The semiconductor device according to claim 2, wherein each of said squares has a length of 5 µm to 1000 µm per side.

4. The semiconductor device according to claim 2, wherein in said plurality of MIM capacitors,
   at least two MIM capacitors are arranged along a first direction, and
   at least two MIM capacitors are arranged along a second direction crossing said first direction.

5. The semiconductor device according to claim 2, wherein said plurality of MIM capacitors are arranged in equal numbers along a first direction and a second direction crossing said first direction.

6. The semiconductor device according to claim 1, wherein a planar pattern of each of said plurality of MIM capacitors is a rectangle.

7. The semiconductor device according to claim 6, wherein said plurality of MIM capacitors are arranged along a first direction with shorter sides opposed to each other, and along a second direction with longer sides opposed to each other, and wherein said plurality of MIM capacitors are arranged so that the number of said MIM capacitors arranged along said first direction is greater than the number of said MIM capacitors arranged along the second direction.

8. The semiconductor device according to claim 1, wherein the guard ring is formed on the same layer as the upper electrodes.

9. The semiconductor device according to claim 1, wherein the guard ring is formed by a titanium nitride film.

10. The semiconductor device according to claim 1, wherein the guard ring is fixed to a prescribed potential.

11. The semiconductor device according to claim 10, wherein the prescribed potential is ground potential.

* * * * *